US012386826B1

(12) United States Patent
Bao et al.

(10) Patent No.: US 12,386,826 B1
(45) Date of Patent: Aug. 12, 2025

(54) METHODS FOR INTELLIGENTLY GENERATING A SEARCH RESULT BASED ON A SIGNIFICANCE OF INFLUENCE OF ONE OR MORE FACTORS ON A DOMINANT FEATURE AND DEVICES THEREOF

(71) Applicant: Jones Lang LaSalle IP, Inc., Chicago, IL (US)

(72) Inventors: Jie Bao, Shanghai (CN); Sheng Guo, Shanghai (CN); Runfei Wang, Shanghai (CN); Siyuan Xu, Beijing (CN); Bingyao Yang, Beijing (CN); Yue Zou, Shanghai (CN)

(73) Assignee: JONES LANG LASALLE IP, INC., Chicago, IL (US)

( * ) Notice: Subject to any disclaimer, the term of this patent is extended or adjusted under 35 U.S.C. 154(b) by 0 days.

(21) Appl. No.: 18/940,768

(22) Filed: Nov. 7, 2024

(51) Int. Cl.
*G06F 16/2453* (2019.01)
*G06F 16/23* (2019.01)
*G06F 16/28* (2019.01)
*G06F 30/27* (2020.01)

(52) U.S. Cl.
CPC ...... *G06F 16/2453* (2019.01); *G06F 16/2358* (2019.01); *G06F 16/289* (2019.01); *G06F 30/27* (2020.01)

(58) Field of Classification Search
CPC .......... G06F 16/2453; G06F 16/2358; G06F 16/289; G06F 30/27
USPC ........................................ 707/748
See application file for complete search history.

(56) References Cited

U.S. PATENT DOCUMENTS

2020/0285999 A1* 9/2020 McGovern ............ G06N 20/00
2022/0385711 A1* 12/2022 Willemsen ......... H04N 21/2187

* cited by examiner

Primary Examiner — Cam Y T Truong
(74) Attorney, Agent, or Firm — Troutman Pepper Locke LLP

(57) ABSTRACT

This technology relates to intelligently generate a search result. A method, computing device, and non-transitory computer readable medium include identifying a plurality of factors relating to a dominant feature of a stored object, and retrieving data associated with the stored object from a storage. For each of the plurality of factors, quantifying a significance of influence the factor on the dominant feature of the stored object, and determining whether the factor is a target factor influencing the dominant feature of the stored object. A generative artificial intelligence processing model is trained with the target factors and associated significances. In response to receiving a search input regarding the stored object, executing the trained generative artificial intelligence processing model to generate and then display a search result.

17 Claims, 11 Drawing Sheets

Answer:

Taiping Finance Tower:
- Iconic Landmark: As one of the tallest buildings in the city, Taiping Finance Tower stands out on the skyline and services as a recognizable landmark for businesses.
- Premium Office Spaces: The tower offers premium office spaces with panoramic views of the cityscape. These well-designed spaces are equipped with advanced technology infrastructure to meet the demands of modern business.
- Excellent Connectivity: Located in a prime business district with excellent transportation links, Taiping Finance Tower provides convenient access to major highways and public transportation hubs.

FIG. 10A

Answer:

Taiping Finance Tower:
- Current Rent (per square meter per month): $304.708 – Although not as high as some other buildings in terms of rental income, this still represents a competitive rental rate for tenants considering its location and features.
- Transportation Composite Index: 6.214 – This index evaluates access to public transportation options such as subway lines and bus routes in proximity to the building. While not exceptionally high, it still suggests decent transportation convenience for occupants.
- Value/Rent Underestimation Index: 4.288 – With a relatively low score on this index, it implies that Taiping Finance Tower might be undervalued compared to its rental price, potentially making it an attractive investment opportunity.

FIG. 10B

METHODS FOR INTELLIGENTLY GENERATING A SEARCH RESULT BASED ON A SIGNIFICANCE OF INFLUENCE OF ONE OR MORE FACTORS ON A DOMINANT FEATURE AND DEVICES THEREOF

FIELD

This technology relates to methods, computing devices, and non-transitory computer readable medium that intelligently generate a search result based on a significance of influence of one or more factors on a dominant feature and devices thereof.

BACKGROUND

Existing search engines and tools for some types of objects have been limited and ineffective because responsive data may be found in a variety of different locations. In particular, existing engines and tools typically have been configured to search for data sources in a particular manner. Unfortunately, for some types of objects, such as real estate properties, the relevant and responsive search data may be located in a diverse set of storage locations. Existing search engines and tools have been unable to effectively identify and correlate responsive data from this diverse set of potential data sources.

By way of example, prior data mining tools have used generative AI to generate a list of responsive objects automatically based on a wider range of data sources. However, the AI generated list with these prior data mining tools depends on a user's insight of the particular type of object to retrieve the right data, which is inefficient, timing consuming, and often incomplete. Accordingly, there is a practical need for a search engine to more intelligently mine and generate a search result.

SUMMARY

A method for intelligently generating a search result includes identifying, by a computing device, a plurality of factors relating to a dominant feature of a stored object. Retrieving data associated with the stored object from a storage by the computing device. For each of the plurality of factors, the computing device quantifies a significance of influence the factor on the dominant feature of the stored object based on the retrieved data, determines whether the quantified significance exceeds a predetermined threshold of the factor, and in response to the determination that the quantified significance exceeds the predetermined threshold, determines the factor as a target factor influencing the dominant feature of the stored object. The method further includes training, by the computing device, a generative artificial intelligence processing model with one or more target factors and the quantified significances of the one or more target factors as training dataset. The method further receives, by the computing device, a search input regarding the stored object via a user interface. The method further executing, by the computing device, the trained generative artificial intelligence processing model by inputting the search input to the trained generative artificial intelligence processing model to generate a search result and displaying the search result via the user interface.

A computing device with a memory comprising programmed instructions stored thereon and one or more processors configured to execute the stored programmed instructions to identify a plurality of factors relating to a dominant feature of a stored object, and retrieve data associated with the stored object from a storage. For each of the plurality of factors, the computing device quantifies a significance of influence the factor on the dominant feature of the stored object based on the retrieved data, determines whether the quantified significance exceeds a predetermined threshold of the factor, and in response to the determination that the quantified significance exceeds the predetermined threshold, determines the factor as a target factor influencing the dominant feature of the stored object. Then the computing device trains a generative artificial intelligence processing model with one or more target factors and the quantified significances of the one or more target factors as training dataset. The computing device further may receive a search input regarding the stored object via a user interface, then execute the trained generative artificial intelligence processing model by inputting the search input to the trained generative artificial intelligence processing model to generate a search result and displaying the search result via the user interface.

A non-transitory computer readable medium having stored thereon instructions comprising executable code which when executed by one or more processors, causes the one or more processors to identify a plurality of factors relating to a dominant feature of a stored object, and retrieve data associated with the stored object from a storage. For each of the plurality of factors, quantifying a significance of influence the factor on the dominant feature of the stored object based on the retrieved data, determining whether the quantified significance exceeds a predetermined threshold of the factor, and in response to the determination that the quantified significance exceeds the predetermined threshold, determining the factor as a target factor influencing the dominant feature of the stored object. Then a generative artificial intelligence processing model is trained with one or more target factors and the quantified significances of the one or more target factors as training dataset. In response to receiving a search input regarding the stored object via a user interface, the trained generative artificial intelligence processing model is executed by inputting the search input to the trained generative artificial intelligence processing model to generate a search result and the search result is displayed via the user interface.

This technology provides a number of advantages including providing methods, non-transitory computer readable media, and computing devices that substantially enhance the intelligent generation of a search result based on a search input. Examples of this technology are able to identify a plurality of factors that have impact on a dominant feature based on a variety of data sources. By quantifying a significance of influence of a factor on the dominant feature, examples of this technology may figure out target factors that have significant influence on the dominant feature. Therefore, the dominant feature may be deconstructed or broken down into a plurality of target factors each of which having respective impact on the dominant feature. With the determined target factors and the quantified significance, a generative artificial intelligence processing model may be trained accordingly and iteratively as needed. In this way, a trained generative artificial intelligence processing model in various examples of this technology may provide unique intelligent search results that are objective and comprehensive with unique insights of a plurality of real estate properties. Examples of this technology may provide a comparison of different objects, such as real estate properties, on a target factor basis, presenting unique reference for a further evaluation of those identified objects. Therefore, examples of this technology disclose herein at least alleviate some of above issues, provides data-driven intelligent search results incorporated additional insights which are impossible or impractical by a manually user input.

BRIEF DESCRIPTION OF THE DRAWINGS

The foregoing and other aspects of the present disclosure can be understood from the following detailed description when read in connection with the accompanying drawings. For the purpose of illustrating this technology, specific examples are shown in the drawings, it being understood, however, that the examples of this technology are not limited to the specific instrumentalities disclosed. Included in the drawings are the following Figures:

FIG. 10A illustrates an exemplary generated search result of a stored object without employing the technology disclosed in this disclosure; and FIG. 10B illustrates an exemplary generated search result of the same stored object by employing the technology disclosed in this disclosure.

DETAILED DESCRIPTION

Figure 1:
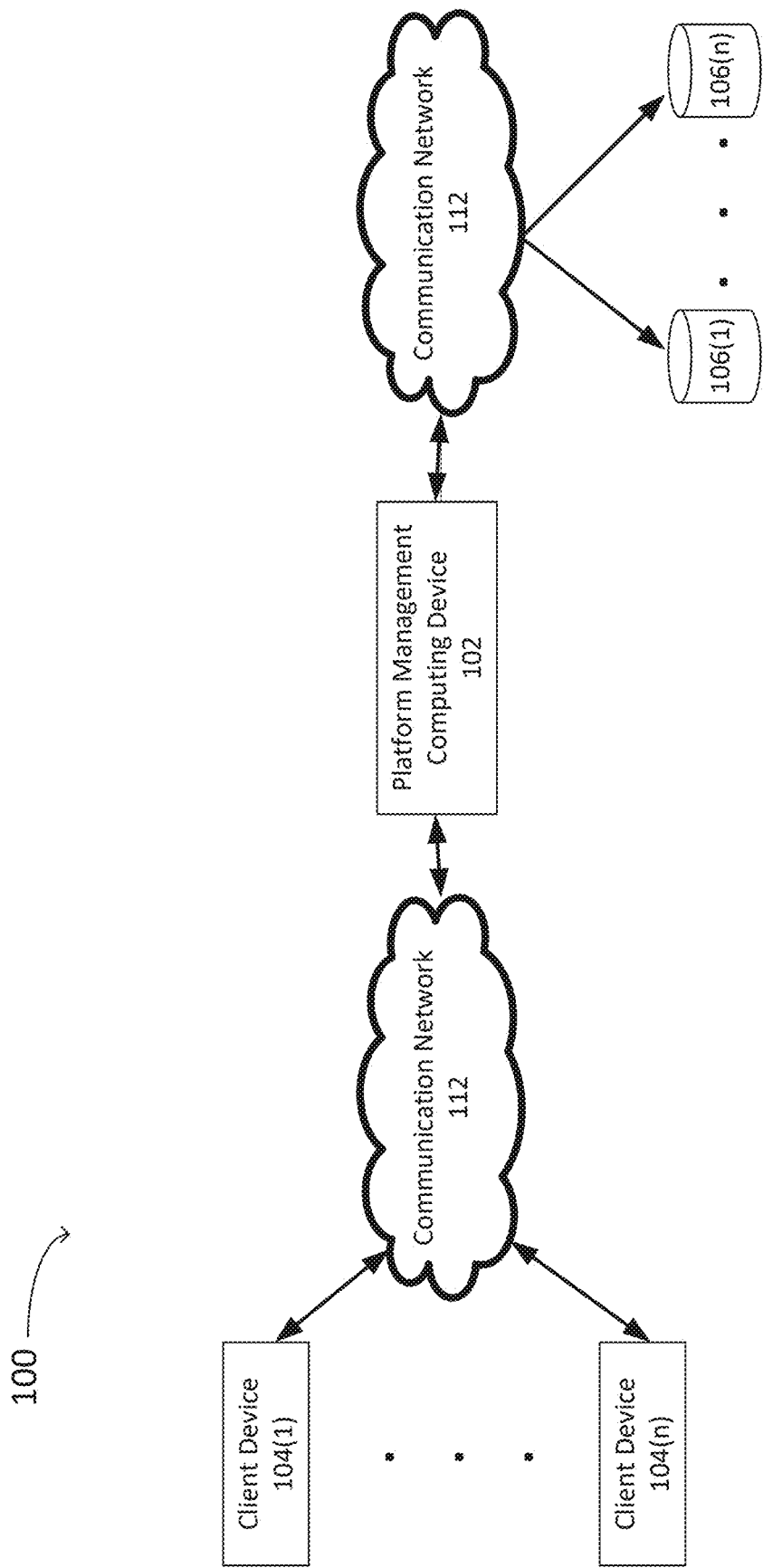
FIG. 1 is a block diagram of an exemplary network environment with a platform management computing device.

A network environment 100 with an exemplary platform management computing device 102 configured to intelligently generate a search result via a user interface (e.g., a customized graphical user interface) is shown in FIG. 1. In this particular example, the environment 100 includes the platform management computing device 102, user devices 104(1)-104(n), and databases 106(1)-106(n) which are coupled together via communication networks 112, although the environment could have other types and/or numbers of other systems, devices, components, and/or other elements in other configurations. This technology provides several advantages including providing methods, non-transitory computer readable media, and computing devices that substantially enhance the intelligent generation of a search result via a user interface.

Figure 2:
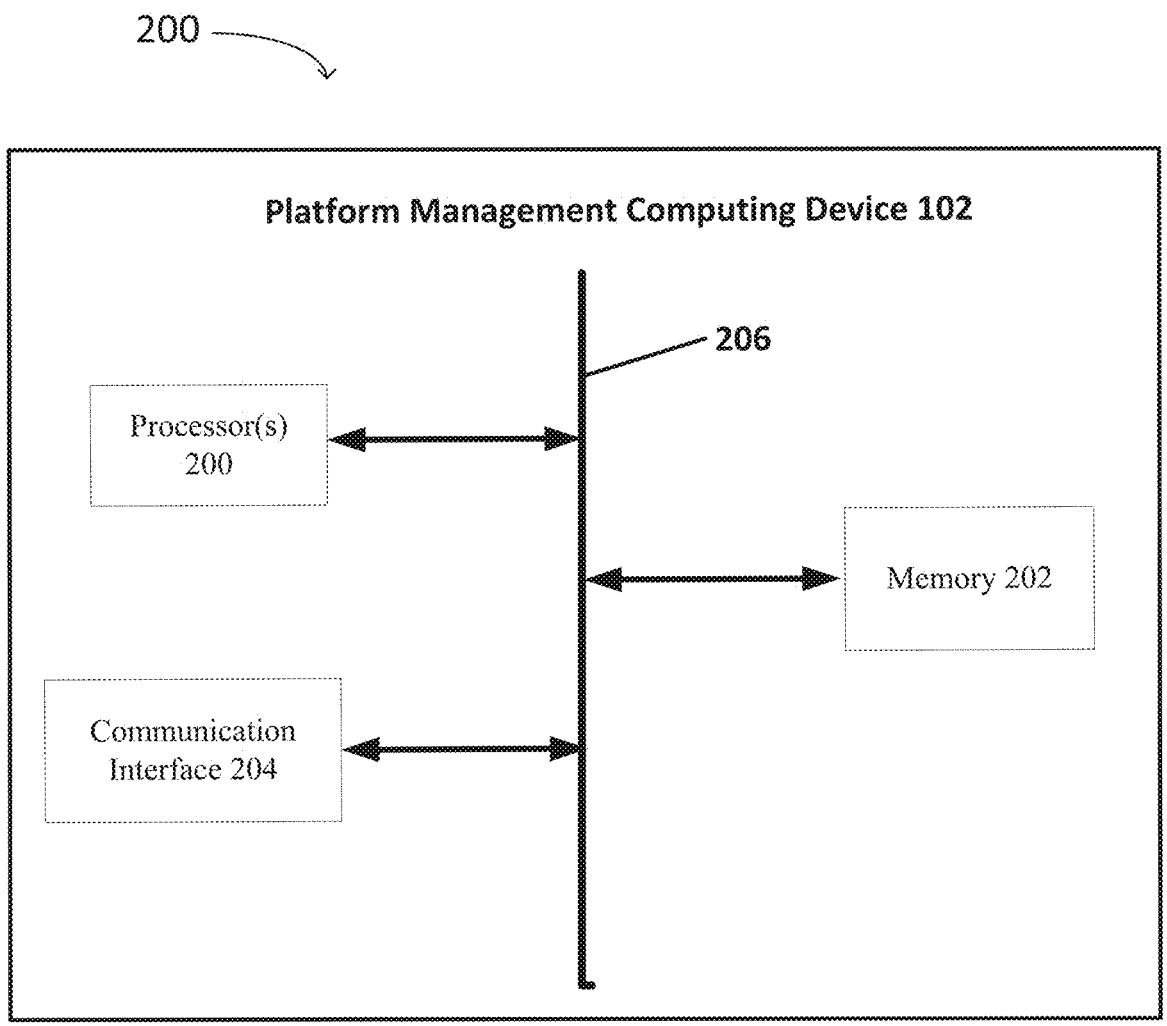
FIG. 2 is a block diagram of an exemplary platform management computing device.

Referring more specifically to FIGS. 1 and 2, the platform management computing device 102 of the network environment 100 may execute a number of different functions and/or other operations as illustrated and described by way of the examples herein, including intelligently generate a search result based on a user's search input (e.g., in natural language) via a user interface. The platform management computing device 102 in this example includes processor(s) 200, a memory 202, and a communication interface 204, which are coupled together by a bus 206, although the platform management computing device 102 can include other types or numbers of elements in other configurations.

The processor(s) 200 of the platform management computing device 102 may execute programmed instructions stored in the memory 202 of the platform management computing device 102 for any number of the functions and other operations as illustrated and described by way of the examples herein. The processor(s) 200 may include one or more central processing units (CPUs) or general-purpose processors with one or more processing cores, for example, although other types of processor(s) can also be used.

The memory 202 of the platform management computing device 102 stores these programmed instructions for one or more aspects of the present technology as described and illustrated herein, although some or all of the programmed instructions could be stored elsewhere. A variety of different types of memory storage devices, such as random access memory (RAM), read only memory (ROM), hard disk, solid state drives, flash memory, or other computer readable medium which is read from and written to by a magnetic, optical, or other reading and writing system that is coupled to the processor(s) 200, can be used for the memory 202.

Accordingly, the memory 202 can store applications that can include computer executable instructions that, when executed by the platform management computing device 102, cause the platform management computing device 102 to execute actions, to intelligently generating a search result as illustrated and described by way of the examples herein. The application(s) can be implemented as components of other applications, operating system extensions, and/or plugins, for example.

Further, the application(s) may be operative in a cloud-based computing environment with access provided via a software-as-a-service model. The application(s) can be executed within or as virtual machine(s) or virtual server(s) that may be managed in a cloud-based computing environment. Also, the application(s), and even the platform management computing device 102 itself, may be located in virtual server(s) running in a cloud-based computing environment rather than being tied to specific physical network computing devices. Also, the application(s) may be running in virtual machines (VMs) executing on the platform management computing device 102 and managed or supervised by a hypervisor.

The communication interface 204 of the platform management computing device 102 operatively couples and communicates between the platform management computing device 102 and one or more of the user devices 104(1)-104(n), and/or the databases 106(1)-106(n), via one or more communication networks 112, although other types or numbers of communication networks or systems with other types or numbers of connections or configurations to other devices or elements can also be used.

While the platform management computing device 102 is illustrated in this example as including a single memory 202 and communication interface 204, the platform management computing device 102 in other examples can include a plurality of memories 202 and communication interfaces 204 as appropriate and needed to implement one or more operations or functionalities of this technology.

Referring to FIG. 1, each of the user devices 104(1)-104(n) includes one or more processors, a memory, user input device(s), such as keyboards and/or mouse pointers by way of example, a display, such as an LED or LCD display device, and a communication interface, which are coupled together by a bus or other communication link, although other types and/or numbers and types of components or other elements in other configurations could be used. In this example, each of the user devices 104(1)-104(n) may interact with the platform management computing device 102 to execute a search of properties in real estate, although the user devices could be operated by other applications to implement other functionalities and operations (e.g., accessing and managing other information, such as other types of assets).

The databases 106(1)-106(n) may store real estate data associated with a variety of properties being accessed by a user in this example, although types and/or combinations of data and/or other programmed instructions may also be stored, and other storage locations may be used. In some examples, instead of storing information of the properties themselves (e.g., size, built year, market value, vacancy rate, etc.), the databases 106(1)-106(n) may additionally store other information relating to the properties, such as nearby transportation, commercial vibrancy, office agglomeration, conveniency of leisure such as restaurants, shopping malls, associated public reviews, or the like.

The communication networks 112 may be, for example, one or more of the same or different combinations of an ad hoc network, an extranet, an intranet, a wide area network (WAN), a virtual private network (VPN), a local area network (LAN), a wireless LAN (WLAN), a wireless WAN (WWAN), a metropolitan area network (MAN), internet, a portion of the internet, a portion of the public switched telephone network (PSTN), a cellular telephone network, a wireless network, a Wi-Fi network, a worldwide interoperability for microwave access (WiMAX) network, or a combination of two or more such networks, although other types and/or numbers of networks in other topologies or configurations may be used.

In the exemplary network environment illustrated in FIG. 1, the platform management computing device 102, the user devices 104(1)-104(n), and the databases 106(1)-106(n) are shown as dedicated hardware devices. However, one or more of the platform management computing devices 102, the user devices 104(1)-104(n), and the databases 106(1)-106(n) can be implemented in software within one or more other devices located at either the same physical place or distributed in the network environment 100.

Although the exemplary network environment 100 with the platform management computing device 102, the user devices 104(1)-104(n), and the databases 106(1)-106(n) are described and illustrated herein, other types or numbers of systems, devices, components, or elements in other topologies can be used in other exemplary network environments. It is to be understood that the systems of the examples described herein are merely for exemplary purposes, as many variations of the specific hardware and software used to implement the examples are possible, as will be appreciated by those skilled in the relevant art(s).

Moreover, one or more of the components depicted in the network environment 100, such as the platform management computing device 102, the user devices 104(1)-104(n), and the databases 106(1)-106(n), for example, may also be configured to operate as virtual instances on the same physical machine. In other words, one or more of the platform management computing devices 102, the user devices 104(1)-104(n), and the databases 106(1)-106(n) may operate on the same physical device rather than as separate devices communicating through one or more communication networks 112.

The examples of this technology may also be embodied as one or more non-transitory computer readable media having instructions stored thereon, such as in the memory 202 by way of example, for one or more aspects of the present technology, as described and illustrated by way of the examples herein. The instructions in some examples include executable code that, when executed by one or more processors, such as the processor(s) 200, cause the processors to carry out steps and operations necessary to implement the methods of the examples of this technology that are described and illustrated herein.

Figure 3:
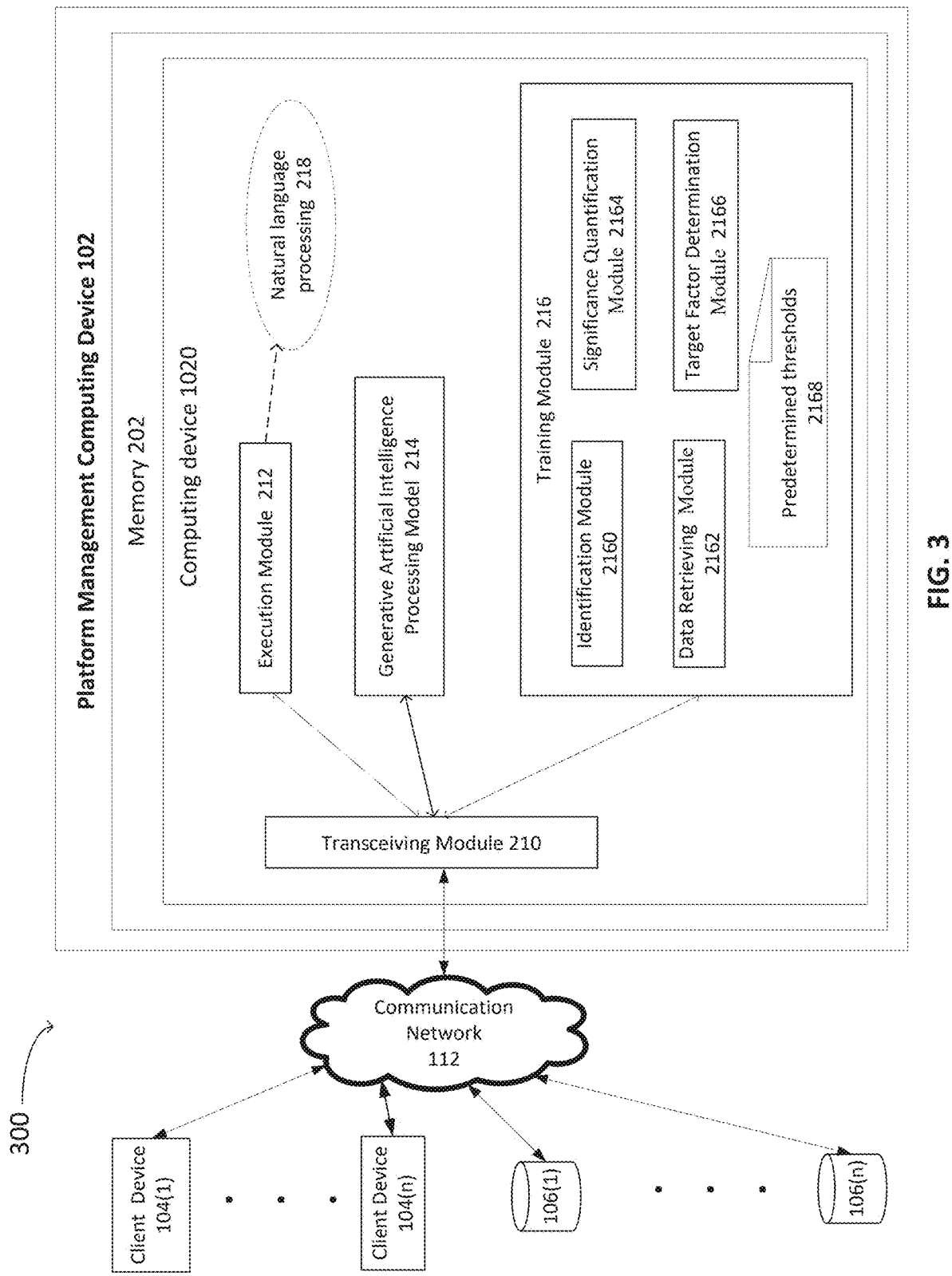
FIG. 3 is a block diagram of an exemplary computing device residing on and being executed by a platform management computing device.

Referring to FIG. 3, a block diagram of an exemplary computing device 1020 is illustrated as residing on and being executed by the platform management computing device 102 for executing one or more steps and operations described herein for this disclosed technology. As shown in FIG. 3, the memory 202 includes the computing device 1020, which in turn comprises a transceiving module 210, an execution module 212, a generative artificial intelligence processing model 214, a training module 216, and optionally a natural language processing 218. The training module 216 may further comprise an identification module 2160, a data retrieving module 2162, a significance quantification module 2164, a target factor determination module 2166, and predetermined thresholds 2168. It is to be understood that the memory 202 may comprise other types and/or numbers of other modules, engines, programmed instructions and/or data.

In this example, the transceiving module 210 may be configured to communicatively connect with one or more user devices 104(1)-104(n) and one or more databases 106(1)-106(n) to allow data transmissions via one or more established connections. The transceiving module 210 allows a plurality of interactions via an established connection, for examples, a search request initiated by any one of user devices 104(1)-104(n)) designated to the computing device 1020, data transmissions from any one of the databases 106(1)-106(n) to the computing device 1020, and data transmissions from the computing device 1020 to any devices mentioned herein. The execution module 212 may be configured to execute the trained generative artificial intelligence processing model 214 by inputting a search input received via the transceiving module 210. Optionally when needed, the execution module 212 may also utilize the natural language processing 218 to process the received search input generated by a user of any of the user devices 104(1)-104(n). By executing the trained generative artificial intelligence processing model 214, the execution module 212 may obtain a generated search result and further cause it to be displayed via the transceiving module 210. Specifically, the execution module 212 may cause the transceiving module 210 to transmit the generated search result to, for example, any of the user devices 104(1)-104(n) transmitting the search input or any other appropriate device connected thereto. Then the search result may be displayed via a user interface. In another example, the generated search result may also be displayed on a screen of the platform management computing device 102 to for example, an operating user. The training module 216 may be configured to train the generative artificial intelligence processing model 214, which will be described in conjunction with FIG. 4.

Details of various operations of those modules in the computing device 1020 will be described below in conjunction with FIG. 4. It is to be understood that those modules may execute other types and/or numbers of other functions and/or operations for other types of applications in other examples. Also, it is to be understood that although certain number of modules are illustrated in FIG. 3, any of those modules can be combined as needed (e.g., combining execution module 212 with training module 216 into a single module, or combining any of identification module 2160, data retrieving module 2162, significance quantification module 2164, and target factor determination module 2166 into less number of modules), or any module may be further split or divided into several sub-modules.

While the platform management computing device 102 is illustrated in FIG. 3 as including a single computing device 1020, the platform management computing device 102 in other examples may include a plurality of computing devices each may having one or more processors (each processor with one or more processing cores) that implement one or more steps of this technology. In these examples, one or more of the computing devices may have a dedicated communication interface or memory. Alternatively, one or more of the computing devices can utilize the memory, communication interface, or other hardware or software components of one or more other computing devices included in the platform management computing device 102. Additionally, one or more of the computing devices that together comprise the platform management computing device 102 in other examples can be standalone devices or integrated with one or more other devices or apparatuses.

Figure 4:
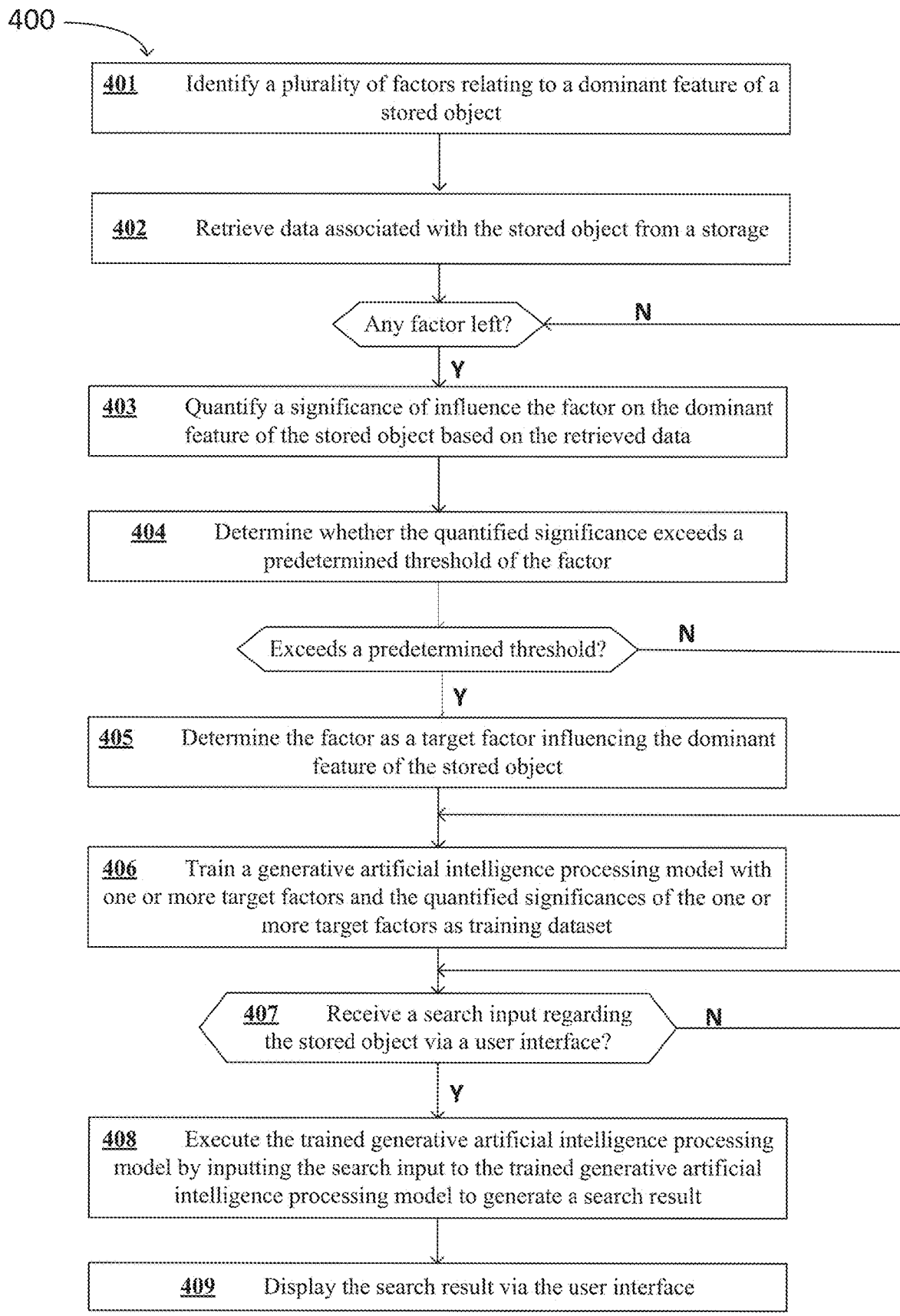
FIG. 4 is a flowchart of an exemplary method for intelligently generating a search result.

Referring to FIG. 4, an exemplary method for intelligently generating a search result is illustrated. In this particular example, the object of the search are real estate properties, but other types of objects may be used. In this example, steps 401-406 relate to operations executed by the training module 216 of the computing device 1020 to train the generative artificial intelligence processing model 214. At step 401, the identification module 2160 of the training module 216 may identify a plurality of factors relating to a dominant feature of a stored object, such as a real estate property by way of example. Herein, the dominant feature is a key feature or an interested feature of the stored object, in this example real estate property, based on which a plurality of factors associated therewith are desired to be figured out and analyzed for a deeper and better understanding of real estate properties. For example, the dominant feature can be leasing price, selling price, residential convenience, effective rent (e.g., the actual cost of renting a property after deducting the value of concessions), property risk (e.g., the possibility of fluctuations in property values and rental income), etc. It is to be understood that for the same dominant feature, different factors may be identified based on user profile. For example, when a user is an individual, the user profile may include, but not limited to, the type of the user, the personal preference, character, career, income, house living needs, etc. As another example, if a user is an enterprise, the user profile may include, but not limited to, the enterprise size, business(es) involved in, history, goals, location, financial status, etc. Taking the leasing price as the dominant feature as an example, factors identified for an individual user and an enterprise can be different. For example, individual users may be more concerned about rent, convenience in daily life, and nearby hospitals and school resources, while corporate users may be more interested in the accompanying business opportunities. Therefore, in some examples, different factors are identified for different type of users. Continue to take the leasing price as the dominant feature and commercial users as an example, a leasing or rental price model may be utilized to identify factors relating to the leasing price of a plurality of real estate properties. In this way, factors considered by tenants in commercial sector when evaluating whether the leasing price matches the received value or benefit are identified by the identification module 2160. In other words, factors are constructed by considering what tenants are willing to pay for. Exemplary factors may include but not limited to transportation (e.g., including both subway, bus, and any other public transportation resources) representing a convenience of public transportation, commercial (e.g., restaurants, 24-hour stores, shopping malls, and any other business) representing a convenience of commercial resources, company density (e.g., companies and respective area, and overall area of those nearby companies in total) representing a potential business opportunity and other beneficial received from the nearby companies, etc.

At step 402, the data retrieving module 2162 of the training module 216 may retrieve data associated with one or more real estate properties from any of the databases 106(1)-106(n) via the transceiving module 210. Herein, the databases 106(1)-106(n) may be internal data resources or external third-party data resources which are either directly or indirectly communicatively connected with the computing device 1020. By way of example, data resources may include but not limited to, map related resources such as Google map, Gaode map, tremendous public reviews on social media such as Yelp, Dianping website, etc. The data retrieving module 2162 may retrieve any data that may be useful to explore the nature and characteristics of related real estate properties as introduced in this disclosure. As an example, a point of interest within certain distance (e.g., 1 mile or km) from a related property may be retrieved for an analysis. In a case that data from a plurality of databases 106(1)-106(n) are retrieved, the computing device 1020 or the data retrieving module 2162 itself or any other appropriate component thereof may further comprise a merge module. The merge module may ingest, clean, and process to cross correlate and merge the retrieved data together. It is to be understood that even though a plurality of databases 106(1)-106(n) are illustrated in FIGS. 1 and 3, any appropriate number of databases 106(1)-106(n) may be selected in a practical network environment and application scenario, such as a single database 106.

Then for each factor identified by the identification module 2160 at step 401, operations of steps 403-405 are executed by the computing device 1020. In this regard, the training module 216 or any other appropriate component of the computing device 1020 may determine whether there is any factor left. If those operations of steps 403-405 have been executed for each factor, the process proceeds to step 406. Otherwise, the process returns and proceeds to step 403 iteratively factor by factor.

Figure 5A:
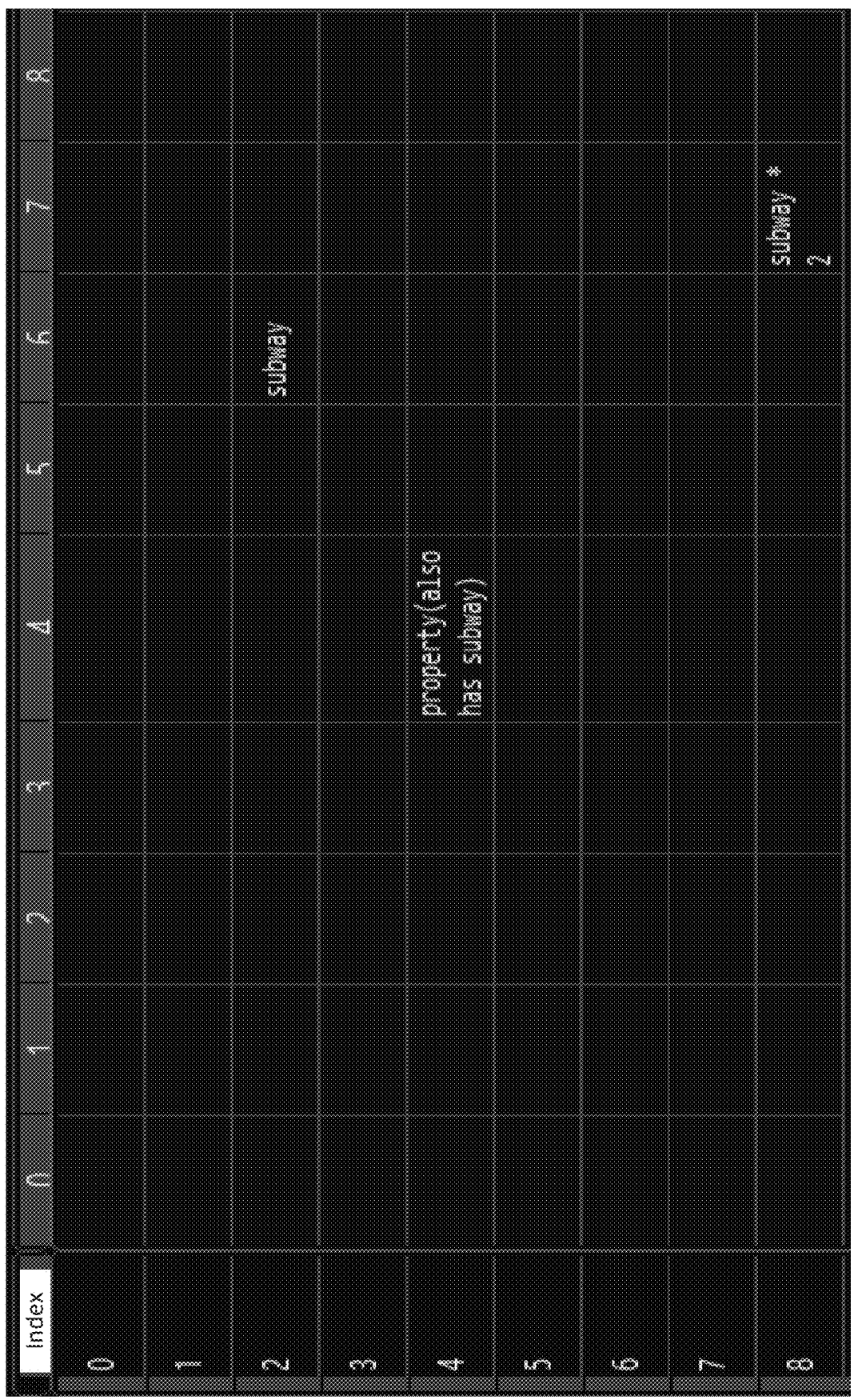
FIGS. 5A and 5B illustrate an exemplary way to quantify a significance of influence of a specific factor.
Figure 5B:

As step 403, the significance quantification module 2164 of the training module 216 may quantify a significance of influence the factor on the dominant feature of by way of example the real estate property based on the data retrieved at step 402. In some examples, the quantification is executed by utilizing regression analysis. By way of example, the regression analysis may include but limited to, an ordinary least squares regression algorithm, minimum variance algorithm, linear regression, decay algorithm, etc. In some examples, the significance quantification module 2164 may take distance as weight and conduct aggregation calculations for a factor. FIGS. 5A and 5B illustrates an exemplary way to quantify a significance of influence of a specific factor. In FIGS. 5A and 5B, the factor is location, and a calculation of its significance influence on leasing price from subway station perspective is illustrated herein. FIG. 5A is a grid diagram showing a location of a specific property (4, 4), wherein each grid represents an area of 200 meters×200 meters. As illustrated in FIG. 5A, there is one subway station near this property at location (2, 6), and two subway stations at location (8, 7). FIG. 5B is a grid diagram showing respective weight assigned to different areas represented by the grids in FIG. 5A, based on a respective distance from the associated property located at (4, 4). Specifically, the location of the property itself is assigned with a weight value 1. Other locations are assigned different weight values based on their distances therebetween. For simplicity, FIG. 5B only shows weight values assigned to one quarter of the grid diagram of FIG. 5A. For the rest three quarters, each area thereof has a mirrored weight value. By way of example, the area or location (2, 6) has a weight value mirrored to location (6, 6) and therefore its weight value is 0.16. Similarly, areas (2, 2) and (6, 2) each has a weight value mirrored to location (6, 6) as well and therefore has a weight value of 0.16. As another example, the areas (0, 1), (0, 7), and (8, 1) each has a weight value mirrored to location (8, 7) and therefore has a weight value of 0.02. Therefore, the significance of influence of factor "location" on the dominant feature of "leasing price" from subway station perspective is calculated below:

$$F(\text{Significance of influence})=1\times1+1\times0.16+2\times0.02=1.2$$

It is to be understood that the subway station may be merely one perspective when evaluating or quantifying the significance of influence that factor "location" has. Additionally, other one or more perspectives may also be considered during the evaluation or quantification process. By way of examples, other public transportations (e.g., bus, train, highway, etc.) in addition to subway may also be considered as well. Similar calculations may be executed for other factors. By way of example, as for the commercial factor described above, this factor may be evaluated and then quantified from the perspective of price, number of reviews, average rates of reviews for each specific nearby business (e.g., aggregated with distance as weights).

It is further to be understood that the weight values assigned in FIG. 5B are merely for the purpose of explaining an exemplary calculation algorithm that can be used to implement step 403. There can be a plurality of other appropriate algorithms to utilize for the purpose of quantifying a significance of influence a factor has on a given dominant feature. Therefore, the implementations discussed herein are not limited to the specific calculations illustrated herein.

At step 404, the target factor determination module 2166 of the training module 216 may determine whether the quantified significance calculated at step 403 exceeds a predetermined threshold of the factor. Step 404 may be executed to evaluate the significance of a factor has on the dominant feature. Then an effectiveness of this factor, or its impact on the dominant feature would be quantified. It is to be understood that a same predetermined threshold may be assigned to each factor, to a type of factor, or each factor may have a different predetermined threshold. Also, the threshold may be determined based on one or more of the user profiles, the dominant feature(s), or the specific factor(s).

Then if the calculated quantified significance is equal to or less than the predetermined threshold, the process would move to its analysis for the next factor, i.e., return to step 403 if there is any factor left. Otherwise, if calculated quantified significance exceeds the predetermined threshold, the process proceeds to step 405.

At step 405, the target factor determination module 2166 of the training module 216 may determine that the factor as a target factor, which influences a given dominant feature of the real estate property as a non-limiting example.

Figure 6:
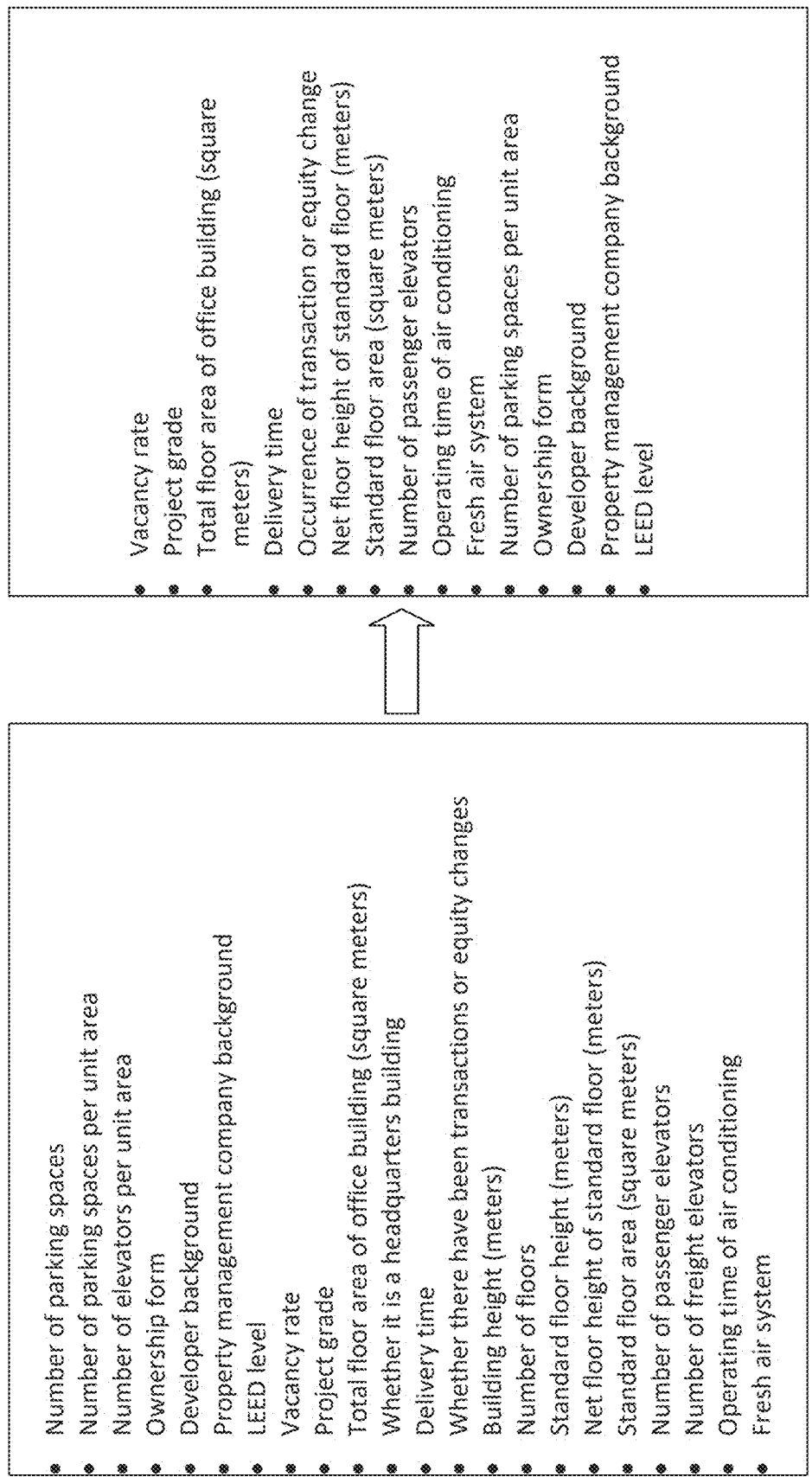
FIG. 6 illustrates an exemplary narrow down of a plurality of identified factors to a plurality of target factors.

By executing operations of steps 403-405 factor by factor and sorting out and discarding one or more factors having not sufficient significance of influence on the dominant feature, the factors identified at step 401 may be narrowed down. Therefore, the number of target factors determined at step 405 may be less than the number of factors identified at step 401. FIG. 6 illustrates an exemplary narrow down of a plurality of identified factors to a plurality of target factors, wherein 22 factors are identified and are narrowed down to 15 target factors.

In some examples, for the factors that are close and similar to each other, the significance quantification module 2164 at step 404 or the target factor determination module 2166 at step 405, may combine such factors. In this regard, such close or similar factors (e.g., the number of elevators, the number of passenger elevators, the number of freight elevators) may be considered as belonging to a same classification of factors, which may be determined based on by way of example, predetermined classification criteria. For such factors, they may be combined into a single factor if a difference between the quantified significances of the factors is less than a predetermined combination threshold. After such combination, the newly generated factor may be stored and maintained for the next implementation of process 400. In this scenario, when process 400 is implemented again, the new factor combined from two or more similar factors may be identified as one factor, and its significance of influence on the dominant feature may be quantified again at step 403. Then if the resulted quantified significance exceeds a corresponding predetermined threshold at step 404, this factor may be determined as a target factor at step 405 during the next implementation of process 400.

It is to be understood that process 400 illustrated in FIG. 4 may be iteratively implemented as needed (e.g., periodically, or initiated upon receiving a trigger instruction). In some examples, process 400 may be implemented in response to retrieving new or updated data (e.g., by the transceiving module 210 from any of databases 106(1)-106(n)). The updated data may be retrieved at predetermined time interval, or as instructed by the system. Then a series of operations described in conjunction with FIG. 4 may be executed again, wherein the quantified significance of a specific factor may be changed resulting in a chance of one or more target factors determined at step 405. Moreover, as described above, the factors identified at step 401 may also be different than the ones identified in previous implementation of process 400. In this way, additional factors may be identified first and then determined as new target factors. Similarly, existing target factors may be determined as not having sufficient significance anymore at step 404 and therefore removed accordingly during a new implementation of process 400. This may introduce a refactor process wherein new factors may be added, and existing old factors may be removed, based on the updated data (e.g., a change of a map, reviews online, etc.). Therefore, a continuous iteration of process 400 may add further intelligent analysis for the real estate properties.

Figure 7:
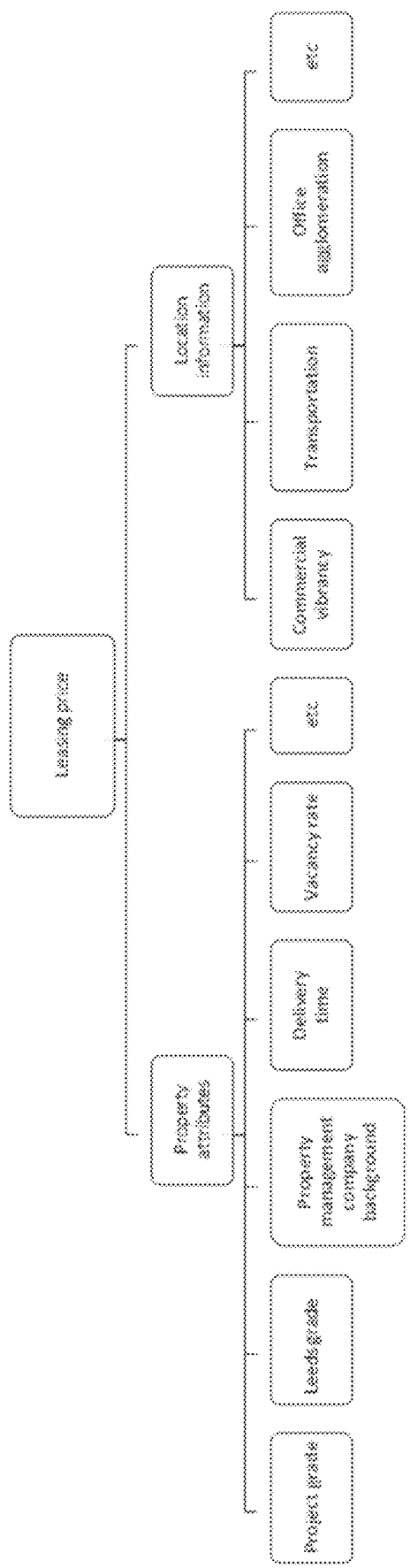
FIG. 7 illustrates an exemplary classification of a plurality of target factors.

In some examples, the computing device 1020 may further classify the obtained target factors based on predetermined classification criteria, resulting in one or more factor classifications of the target factors. FIG. 7 illustrates an exemplary classification or grouping of a plurality of target factors. As shown in FIG. 7, target factors determined at step 405 are further classified into two groups or classifications, i.e., property attributes and location information. In this example, after implementing steps of 401-405 of process 400, the obtained results indicates that these two main perspectives or concerns are taken into account by a user in relation to a leasing price. In particular, a user may be willing to pay for the benefits obtained from the property itself (i.e., the property's own value), and the convenience of the surrounding area where the property is located (i.e., a value received by its surrounding geographical location). Then referring to FIG. 7, within each classification, there are a plurality of factors reflecting the convenience from different perspectives. In this specific example, it is founded that 75%-80% of the leasing price is interpreted or explained by the constructed factors in FIG. 7. It is to be understood that whether to have a classification or grouping operation, and how many classifications and how many target factors to arrange may be determined based on the specific application environment. For example, it may depend on a desired accuracy on an analysis or explanation of a given dominant feature by the constructed factors.

Figure 8:
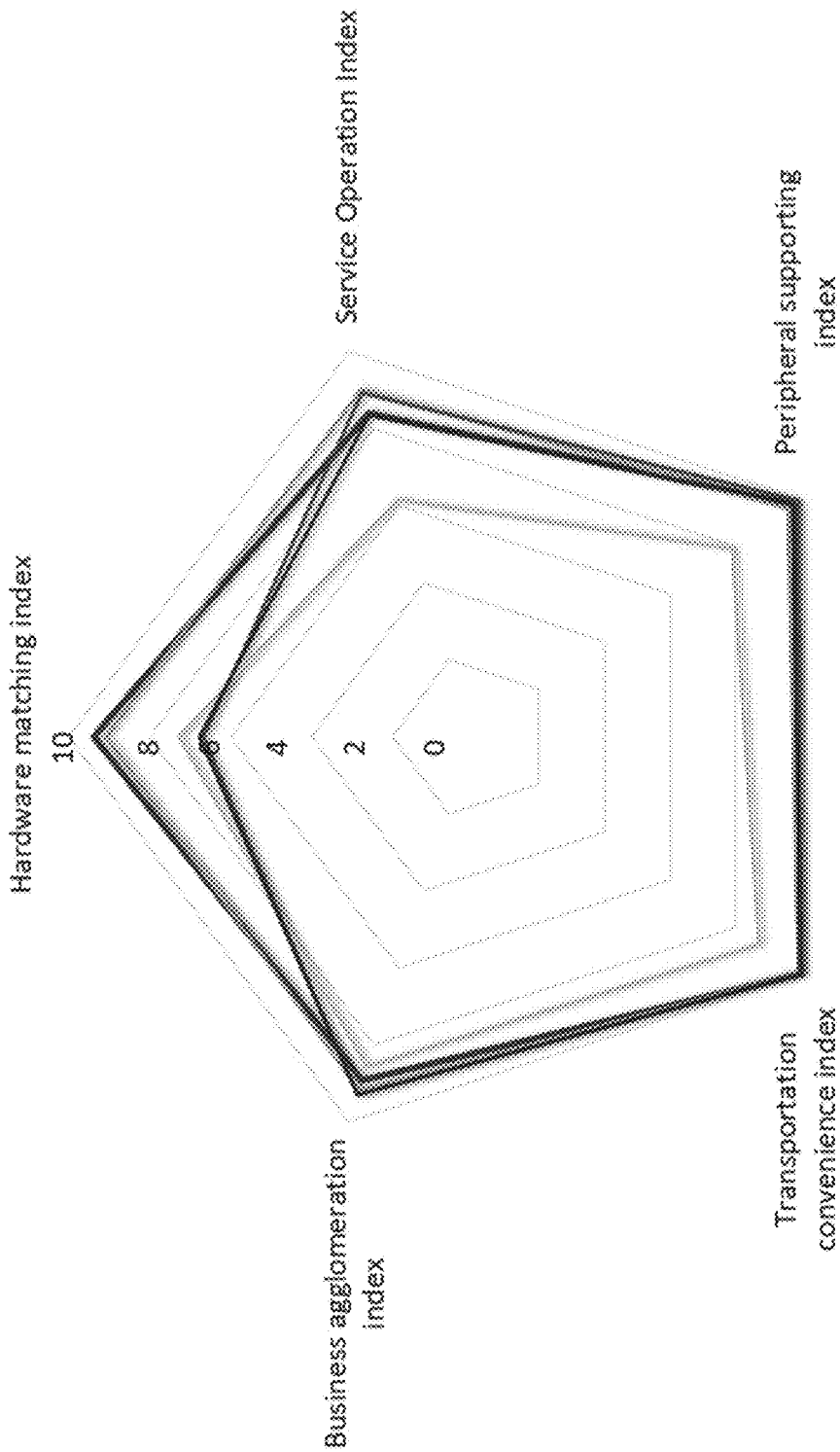
FIG. 8 illustrates another exemplary deconstruction of a dominant feature for a plurality of properties.

Continue to take leasing price as the dominant feature as an example, similar deconstruction may be made to analyze factors that affect the leasing price. Then a degree of influence of each factor may be quantified accordingly. FIG. 8 illustrates another exemplary deconstruction of a dominant feature for a plurality of properties. In FIG. 8, to reflect the leasing price from different dimension, the leasing price is deconstructed by the computing device 1020 into five classifications, i.e., hardware matching index, business agglomeration index, transportation convenience index, peripheral supporting index, and service operation index. Herein, each or any number of those five indexes may be aggregated from or include a plurality of different factors. Among the five indexes, the hardware matching index and the service operation index may relate to the condition, status and characteristics of the property itself. The rest three indexes, i.e., the business agglomeration index, transportation convenience index, and peripheral supporting index may relate to other characteristics of the surrounding area. In FIG. 8, leasing prices of five different real estate properties (e.g., commercial office buildings) are analyzed based on the five indexes and represented in different colors. Specifically, a higher score (i.e., closer to the index and farther from the center) means a better fit into a specific index. Accordingly, building characteristics are broken down or deconstructed into a plurality of indexes. This allows a quantification of any differences among different properties. Referring to FIG. 8, such break down and quantification provide a straightforward comparison among a plurality of properties. The comparison may reflect not only the characteristics or features of the properties themselves, but also additional accompanying features benefiting from various nearby resources. Such comparison may provide an intelligent analysis of price composition for a plurality of properties. It is to be understood that FIG. 8 is merely an exemplary illustration of the break down and deconstruction of a dominant feature for a plurality of properties. In some examples, instead of presenting a diagram, a ranking list may be provided with an aggregated total score for each related property based on the constructed factors or classifications.

At step 406, the training module 216 may utilize the target factors determined at step 405 and the associated quantified significances obtained at step 404 as training dataset, to train the generative artificial intelligence processing model 214. In a scenario that classification(s) of the target factors are executed, the one or more factor classifications may also be included in the training dataset. In a case wherein the process 400 is implemented iteratively, the training at step 406 may be executed iteratively as needed.

Figure 9:
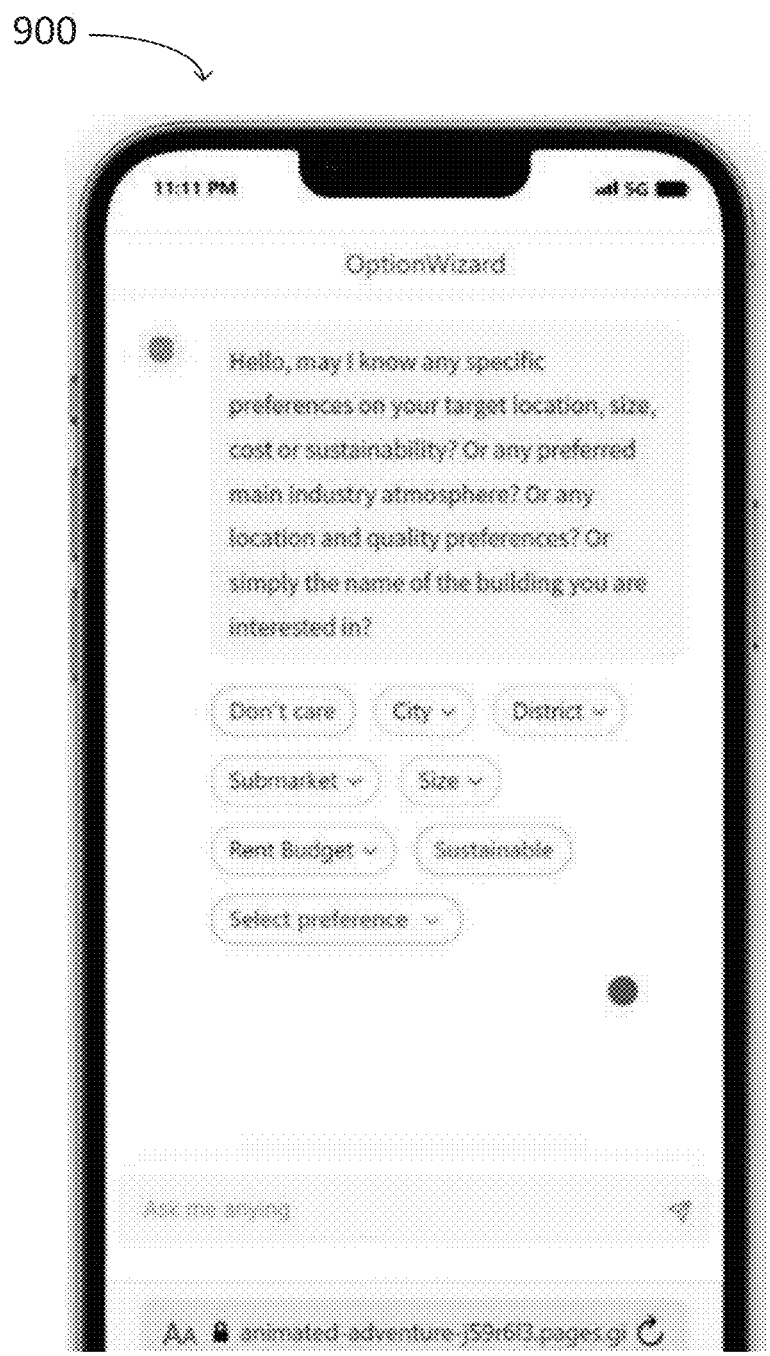
FIG. 9 illustrates an exemplary graphical user interface.

At step 407, the transceiving module 210 of the of the computing device 1020 may receive a search input regarding the real estate property. The search input may be generated at any of the user devices 104(1)-104(n) and transmitted therefrom via one or more communication networks 112. In this regard, the platform management computing device 102 may provide a graphical user interface 900 as illustrated in FIG. 9, and the computing device 1020 executed at back end may receive data a user input into the graphical user interface 900 via the transceiving module 210. A user may access to the graphical user interface 900 via a browser or a mobile application installed on any of the user devices 104(1)-104(n). The search input may comprise natural language text input by a user via the user device 900. In some other examples, the search input may comprise natural language voice input by the user via the user device 900. With the search input, the user wants to filter out the properties that the user may be interested in from hundreds or thousands of properties stored in related data storage. For example, the user may choose the interested area, property size, location, price, etc. It is to be understood that a more or less intelligent user interface may be employed, which is different than the exemplary user interface 900 illustrated in FIG. 9. The computing device (e.g., computing device 1020 in FIG. 3) may employ the natural language processing 218 which enables Artificial Intelligence technology to analyze and interpret the natural language within the search input (e.g., machine learning model(s) trained by one or more neural networks).

At step 408, the execution module 212 of the of the computing device 1020 may execute the trained generative artificial intelligence processing model 214. Particularly, the execution module 212 may input the search input or processed search input into the trained generative artificial intelligence processing model 214, to generate a search result.

At step 409, the execution module 212 or other appropriate component of the of the computing device 1020 may cause a transmission of the generated search result via the transceiving module 210, resulting in displaying the search result via the user interface (e.g., graphical user interface 900 illustrated in FIG. 9) as a response to the search input submitted by the user. In this way, any of the user devices 104(1)-104(n) may get benefit of the intelligent search as discussed in this disclosure through interactions between any of the user devices 104(1)-104(n) and the platform management computing device 102.

FIG. 10A illustrates an exemplary generated search result of a real estate property without employing the technology disclosed in this disclosure. As illustrated in FIG. 10A, the search result introduces a specific property "Taiping Finance Tower" at a high level with general language. To the contrary, FIG. 10B illustrates an exemplary generated search result of the same real estate property by employing the technology disclosed in this disclosure. As shown in FIG. 10B, an introduction of the same real estate property provides more helpful insights to a user. By way of example, the introduction provides detailed analysis on rent, transportation, and the actual value as compared to its rent for the same real estate property. By training the generative artificial intelligence processing model 214 with the constructed target factors as discussed in this disclosure, the trained generative artificial intelligence processing model 214 may be better at composing appropriate prompts based on the search input of a user. In this way, a more straightforward introduction of a property may be provided to a user. For example, when the search input is "more nearby subway stations," the trained generative artificial intelligence processing model 214 may compose a "better traffic" prompt based on the constructed target factors (e.g., "traffic" is one of the target factors). In some other examples, when a search input relates to "Taiping Finance Tower," the trained generative artificial intelligence processing model 214 may compose a prompt of "Compare Taiping Finance Tower to the other building and highlight the best three points." In this way, the trained generative artificial intelligence processing model 214 may generate and return an introduction of the Taiping Finance Tower at a detailed level (e.g., as illustrated in FIG. 10B) with more insights for a user. In some further examples, if a search input relates to comparisons of a plurality of properties, the trained generative artificial intelligence processing model 214 may compose appropriate prompt(s) to generate straightforward search result to a user (e.g., with straightforward comparisons in diagram, table, list, or textual descriptions, etc.).

It is to be understood that although the technology is described with a search of real property as an example, the technology is not limited to this and may be used for searching other stored data. For example, for searching objects or features whose values are determined by many factors and require model(s) to quantify the significance of those factors' influences (e.g., environmental goods that connected to environmental protection).

Accordingly, as described and illustrated by way of the examples herein, this technology provides methods, non-transitory computer readable media, and computing devices that intelligently generate a search result for a search input. As illustrated by the examples herein, this technology provides intelligent search results with more insights for a user, which is impossible by manual work or existing searching tools. Specifically, various examples described herein may deconstruct and break down factors affecting one or more dominant feature and quantify the significance of influence of each factor on the dominant feature, based on a wide range of internal and external data sources. Those constructed target factors empowers a generative artificial intelligence processing model to generate informative search result for a user. In some examples, the generative artificial intelligence processing model trained with the constructed target factors may compose appropriate prompts and therefore provide unique insights as compared to existing searching engines or tools. Accordingly, the technology discussed in this disclosure uniquely allow different properties to be comparable to each other on factor basis, offering an objective and comprehensive reference for comparison and evaluation of different properties. Additionally, iterated executions may be executed based on updated data to refactor, add new factors, remove outdated factors, or aggregate similar factors. Therefore, an intelligent search result generated in this disclosure may provide a more powerful, objective, informative, and comprehensive reference for evaluate the stored objects such as a real estate property on a real time basis. Moreover, the intelligence may facilitate a user to quickly locate target properties which reflects market perspective, trends or user preferences. In some examples, a generated search result may also facilitate to evaluate a value of land, identify undervalued properties that can be improved by internal renovation or property service to enhance the asset utilization efficiency, etc.

Having thus described the basic concept of the invention, it will be rather apparent to those skilled in the art that the foregoing detailed disclosure is intended to be presented by way of example only and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations, therefore, is not intended to limit the claimed processes to any order except as may be specified in the claims. Accordingly, the invention is limited only by the following claims and equivalents thereto.

What is claimed is:

1. A method comprising:
    identifying, by a computing device, a plurality of factors relating to a dominant feature of a stored object in a storage device;
    retrieving, by the computing device, data associated with the stored object from the storage device;
    in response to the retrieving the data, for each factor of the plurality of factors, execute:
        quantifying, by the computing device, a significance of influence of the factor on the dominant feature of the stored object based on the retrieved data;
        determining, by the computing device, whether the quantified significance exceeds a predetermined threshold of the factor;
        in response to the determination that the quantified significance exceeds the predetermined threshold, determining, by the computing device,
    the factor as a target factor influencing the dominant feature of the stored object; and
        classifying, by the computing device, the target factors based on predetermined classification criteria to obtain one or more factor classifications of the target factors;
    training, by the computing device, a generative artificial intelligence processing model with one or more target factors of the target factors, the quantified significances of the one or more target factors, and the one or more factor classifications of the target factors as training dataset;
    receiving, by the computing device from a user device, a search input regarding the stored object via a user interface of the user device;
    executing, by the computing device, the trained generative artificial intelligence processing model by inputting the search input to the trained generative artificial intelligence processing model to generate a search result; and
    displaying, via the user interface, the search result as a response to the search input regarding the stored object.

2. The method as set forth in claim 1, further comprising:
    retrieving, by the computing device, updated data associated with the stored object from the storage device at a predetermined time interval; and
    quantifying, by the computing device, significances of influence of one or more of the plurality of factors on the dominant feature of the stored object based on the updated data.

3. The method as set forth in claim 2, further comprising:
    identifying, by the computing device, additional factors relating to the dominant feature of the stored object based on the updated data associated with the stored object or the quantified significances of the plurality of factors.

4. The method as set forth in claim 1, further comprising:
  identifying, by the computing device, two or more factors of the plurality of factors belonging to a same factor classification based on the predetermined classification criteria;
  determining, by the computing device, a difference between the quantified significances of the two or more factors being less than a predetermined combination threshold; and
  combining, by the computing device, the two factors as a single factor of the plurality of factors.

5. The method as set forth in claim 1, wherein the quantifying the significance of influence of the factor on the dominant feature comprises,
  executing an ordinary least squares regression to quantify the significance of influence of the factor on the dominant feature of the stored object based on the retrieved data.

6. The method as set forth in claim 1, wherein the plurality of factors is identified based on a type of a user.

7. A computing device, the computing device comprising a memory comprising programmed instructions stored thereon and one or more processors configured to execute the stored programmed instructions to:
  identify a plurality of factors relating to a dominant feature of a stored object in a storage device;
  retrieve data associated with the stored object from the storage device;
  in response to the retrieving the data, for each factor of the plurality of factors, execute:
    quantify a significance of influence of the factor on the dominant feature of the stored object based on the retrieved data;
    determine whether the quantified significance exceeds a predetermined threshold of the factor;
    in response to the determination that the quantified significance exceeds the predetermined threshold, determine the factor as a target factor influencing the dominant feature of the stored object; and
    classify the target factors based on predetermined classification criteria to obtain one or more factor classifications of the target factors;
  train a generative artificial intelligence processing model with one or more target factors of the target factors, the quantified significances of the one or more target factors, and the one or more factor classifications of the target factors as training dataset;
  receive, from a user device, a search input regarding the stored object via a user interface of the user device;
  executing, by the computing device, the trained generative artificial intelligence processing model by inputting the search input to the trained generative artificial intelligence processing model to generate a search result; and
  display, via the user interface, the search result as a response to the search input regarding the stored object.

8. The computing device as set forth in claim 7, further comprising:
  retrieve updated data associated with the stored object from the storage device at a predetermined time interval; and
  quantify significances of influence of one or more of the plurality of factors on the dominant feature of the stored object based on the updated data.

9. The computing device as set forth in claim 8, further comprising:
  identify additional factors relating to the dominant feature of the stored object based on the updated data associated with the stored object or the quantified significances of the plurality of factors.

10. The computing device as set forth in claim 7, further comprising:
  identify two or more factors of the plurality of factors belonging to a same factor classification based on the predetermined classification criteria;
  determine a difference between the quantified significances of the two or more factors being less than a predetermined combination threshold; and
  combine the two factors as a single factor of the plurality of factors.

11. The computing device as set forth in claim 7, wherein the quantifying the significance of influence of the factor on the dominant feature comprises execute an ordinary least squares regression to quantify the significance of influence of the factor on the dominant feature of the stored object based on the retrieved data.

12. The computing device as set forth in claim 7, wherein the plurality of factors is identified based on a type of a user.

13. A non-transitory computer readable medium having stored thereon instructions comprising executable code which when executed by one or more processors, causes the processors to:
  identify a plurality of factors relating to a dominant feature of a stored object in a storage device;
  retrieve data associated with the stored object from the storage device;
  in response to the retrieving the data, for each factor of the plurality of factors, execute:
    quantify a significance of influence of the factor on the dominant feature of the stored object based on the retrieved data;
    determine whether the quantified significance exceeds a predetermined threshold of the factor;
    in response to the determination that the quantified significance exceeds the predetermined threshold, determine the factor as a target factor influencing the dominant feature of the stored object; and
    classify the target factors based on predetermined classification criteria to obtain one or more factor classifications of the target factors;
  train a generative artificial intelligence processing model with one or more target factors of the target factors, the quantified significances of the one or more target factors, and the one or more factor classifications of the target factors as training dataset;
  receive, from a user device, a search input regarding the stored object via a user interface of the user device;
  executing, by the computing device, the trained generative artificial intelligence processing model by inputting the search input to the trained generative artificial intelligence processing model to generate a search result; and
  display, via the user interface, the search result as a response to the search input regarding the stored object.

14. The non-transitory computer readable medium as set forth in claim 13, further comprising:
  retrieve updated data associated with the stored object from the storage device at a predetermined time interval; and
  quantify significances of influence of one or more of the plurality of factors on the dominant feature of the stored object based on the updated data.

15. The non-transitory computer readable medium as set forth in claim 14, further comprising:
    identify additional factors relating to the dominant feature of the stored object based on the updated data associated with the stored object or the quantified significances of the plurality of factors.

16. The non-transitory computer readable medium as set forth in claim 13, further comprising,
    identify two or more factors of the plurality of factors belonging to a same factor classification based on the predetermined classification criteria;
    determine a difference between the quantified significances of the two or more factors being less than a predetermined combination threshold; and
combine the two factors as a single factor of the plurality of factors.

17. The non-transitory computer readable medium as set forth in claim 13, wherein the quantifying the significance of influence of the factor on the dominant feature comprises execute an ordinary least squares regression to quantify the significance of influence of the factor on the dominant feature of the stored object based on the retrieved data.

\* \* \* \* \*